(12) United States Patent
Shih et al.

(10) Patent No.: US 9,397,048 B1
(45) Date of Patent: Jul. 19, 2016

(54) SEMICONDUCTOR STRUCTURE AND MANUFACTURING METHOD THEREOF

(71) Applicant: Inotera Memories, Inc., Taoyuan (TW)

(72) Inventors: Shing-Yih Shih, New Taipei (TW); Tieh-Chiang Wu, Taoyuan (TW)

(73) Assignee: INOTERA MEMORIES, INC., Taoyuan (TW)

( * ) Notice: Subject to any disclaimer, the term of this patent is extended or adjusted under 35 U.S.C. 154(b) by 0 days.

(21) Appl. No.: 14/664,932

(22) Filed: Mar. 23, 2015

(51) Int. Cl.
*H01L 23/48* (2006.01)
*H01L 23/535* (2006.01)
*H01L 21/768* (2006.01)

(52) U.S. Cl.
CPC ........ *H01L 23/535* (2013.01); *H01L 21/76831* (2013.01); *H01L 21/76877* (2013.01); *H01L 21/76898* (2013.01)

(58) Field of Classification Search
CPC .................. H01L 21/76898; H01L 21/76831; H01L 21/76877
USPC ........................................................ 257/774
See application file for complete search history.

(56) References Cited

U.S. PATENT DOCUMENTS

| 8,097,964 | B2 | 1/2012 | West et al. | |
| 8,816,407 | B2 | 8/2014 | Kim et al. | |
| 2004/0084778 | A1* | 5/2004 | Hosoda | H01L 23/5329 257/758 |
| 2007/0108572 | A1* | 5/2007 | Hsu | H01L 21/486 257/678 |
| 2008/0079159 | A1* | 4/2008 | Gupta | H01L 23/53295 257/758 |
| 2010/0171226 | A1* | 7/2010 | West | H01L 23/481 257/774 |
| 2011/0095436 | A1* | 4/2011 | Chen | H01L 21/76898 257/774 |
| 2014/0264916 | A1* | 9/2014 | Chao-Yuan | H01L 23/481 257/774 |
| 2014/0264918 | A1* | 9/2014 | Huang | H01L 23/481 257/774 |

FOREIGN PATENT DOCUMENTS

TW          I434389 B          4/2014

\* cited by examiner

*Primary Examiner* — Douglas Menz
(74) *Attorney, Agent, or Firm* — CKC & Parteners Co., Ltd.

(57) ABSTRACT

A semiconductor structure includes a substrate, a first through hole disposed in the substrate and filled with conductive material, and a second through hole disposed in the substrate and filled with isolation material, which a Young's modulus of the isolation material is smaller than a Young's modulus of the conductive material to balance stress from the conductive material.

14 Claims, 22 Drawing Sheets

SEMICONDUCTOR STRUCTURE AND MANUFACTURING METHOD THEREOF

BACKGROUND

Description of Related Art

In order to improve performance and functionality of integrated circuits, three-dimensional (3D) stacking technology are generally applied in the next generation. Through silicon vias (TSV's) are generally used to create a 3D stacking, which could be diced or polished after bonding.

However, differences of thermal properties between a substrate and the internal devices could degrade interface properties under thermal cycling conditions and result in wafer warpage, which significantly impacts the electrical performance of the devices.

Therefore, improved semiconductor structure and manufacturing method thereof are necessary to reduce the risk of wafer warpage, and thus increases the yield of the semiconductor structure.

SUMMARY

The present disclosure provides a semiconductor structure. The semiconductor structure includes a substrate, a first through hole disposed in the substrate and filled with conductive material, and a second through hole disposed in the substrate and filled with isolation material, which a Young's modulus of the isolation material is smaller than a Young's modulus of the conductive material to balance stress from the conductive material.

In various embodiments of the present disclosure, the conductive material includes copper, tungsten, polysilicon, or combination thereof.

In various embodiments of the present disclosure, the Young's modulus of the conductive material is over than 110 GPa.

In various embodiments of the present disclosure, the Young's modulus of the isolation material is smaller than 100 GPa.

In various embodiments of the present disclosure, the Young's modulus of the isolation material is in a range from about 5 GPa to about 100 GPa.

In various embodiments of the present disclosure, the Young's modulus of the isolation material is in a range from about 5 GPa to about 50 GPa.

In various embodiments of the present disclosure, the isolation material includes spin-on glass, spin-on dielectric, polyimide, silicon dioxide, or combination thereof.

In various embodiments of the present disclosure, the second through hole is filled with isolation materials having different Young's modulus to form a multi-layer structure in the second through hole.

In various embodiments of the present disclosure, the first through hole and the second through have the same depth.

In various embodiments of the present disclosure, the first through hole and the second through have different depths.

In various embodiments of the present disclosure, the substrate has a first surface and a second surface opposite to the first surface.

In various embodiments of the present disclosure, the first through hole and the second through hole extend from the first surface to the second surface.

In various embodiments of the present disclosure, the first through hole and the second through hole extend from the second surface to the first surface.

In various embodiments of the present disclosure, the second through hole surrounds the first through hole.

The present disclosure provides a semiconductor structure. The semiconductor structure includes a substrate having an active region and a dummy region surrounding the active region. An active TSV is disposed in the active region and filled with conductive material, and a dummy TSV is disposed in the dummy region and filled with isolation material, which a Young's modulus of the isolation material is smaller than 100 GPa.

The present disclosure provides a process of manufacturing a semiconductor structure, and the process includes following steps. A first through hole and a second through hole are formed in the substrate, which the first through hole is filled with the conductive material, and the second through hole is filled with isolation material having a Young's modulus smaller than 100 GPa.

In various embodiments of the present disclosure, the first through hole and the second through hole are formed in the substrate by following steps. A mask is formed on the substrate, which is removed through the mask to form the first through hole and the second through hole.

In various embodiments of the present disclosure, further includes following steps. A photoresist is covered over the first through hole, and the second through hole is filled with isolation material. After that, the photoresist is removed, and the first through hole is filled with conductive material.

In various embodiments of the present disclosure, further includes following steps. The isolation material is filled in the he first through hole and the second through hole, and a photoresist is covered over the second through hole. After that, the isolation material in the first through hole is removed, and the first through hole is filled with conductive material.

In various embodiments of the present disclosure, the first through hole and the second through hole are formed at the same time.

These and other features, aspects, and advantages of the present disclosure will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The disclosure could be more fully understood by reading the following detailed description of the embodiment, with reference made to the accompanying drawings as follows.

DETAILED DESCRIPTION

Figure 1:
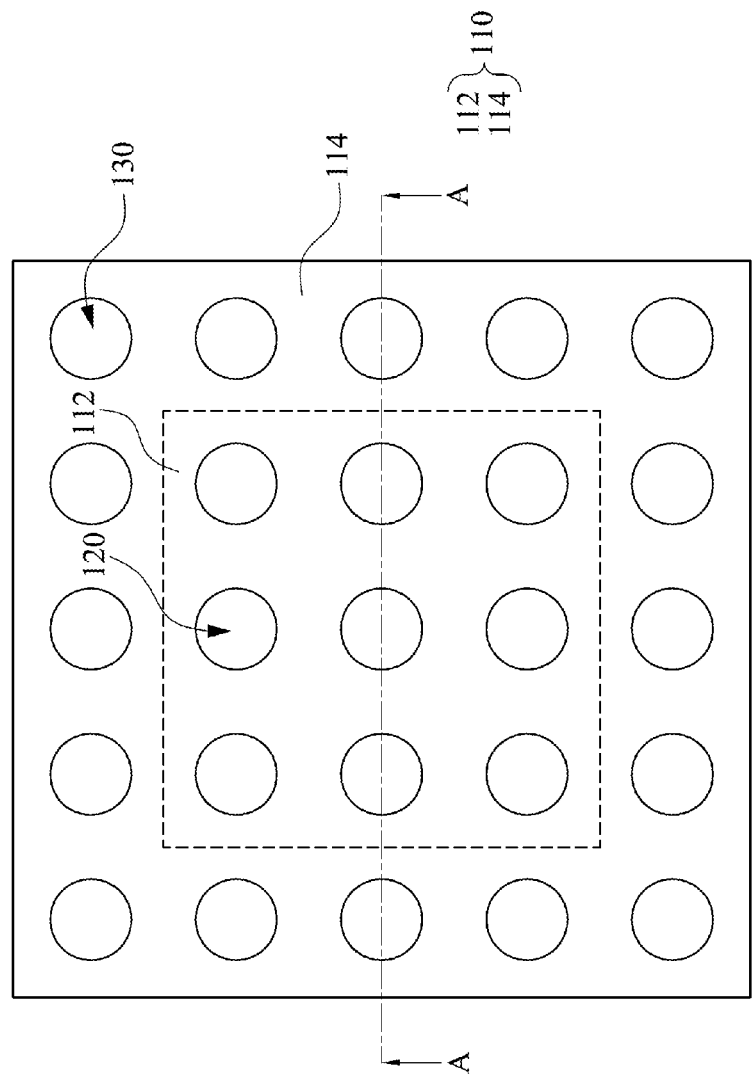
FIG. 1 is a top view of a semiconductor structure according to various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

Please refer to FIG. 1. FIG. 1 is a top view of a semiconductor structure according to various embodiments of the present disclosure. A semiconductor structure 100 includes a substrate 110, a first through hole 120 and a second through hole 130. The substrate 110 include an active region 112 and a dummy region 114 surrounding the active region 112, which the first through hole 120 is disposed in the active region 112 of the substrate 110, and the second through hole 130 is disposed in the dummy region 114 of the substrate 110.

Figure 2A:
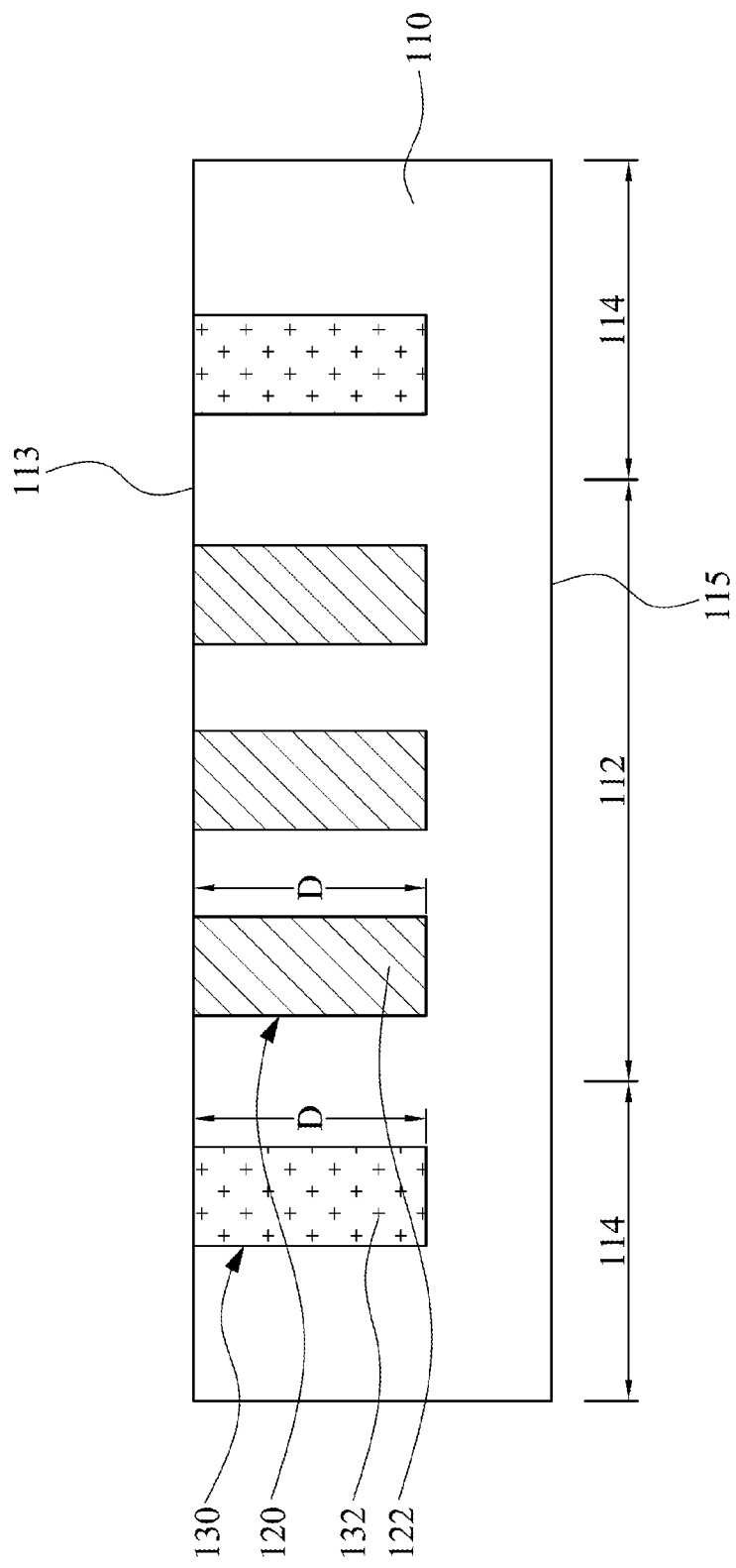
FIG. 2A is a cross-sectional view of the semiconductor structure in FIG. 1 along the line AA, according to various embodiments of the present disclosure

Please refer to FIG. 2A, FIG. 2A is a cross-sectional view of the semiconductor structure in FIG. 1 along the line AA, according to various embodiments of the present disclosure. As illustrated in FIG. 2A, the substrate 110 includes a first surface 113 and a second surface 115 opposite to the first surface 113, and the first through hole 120 and the second through hole 130 extend from the first surface 113 to the second surface 115, but not limited thereto. In various embodiments, the first through hole 120 and the second through hole 130 extend from the second surface 115 to the first surface 113.

Figure 2B:
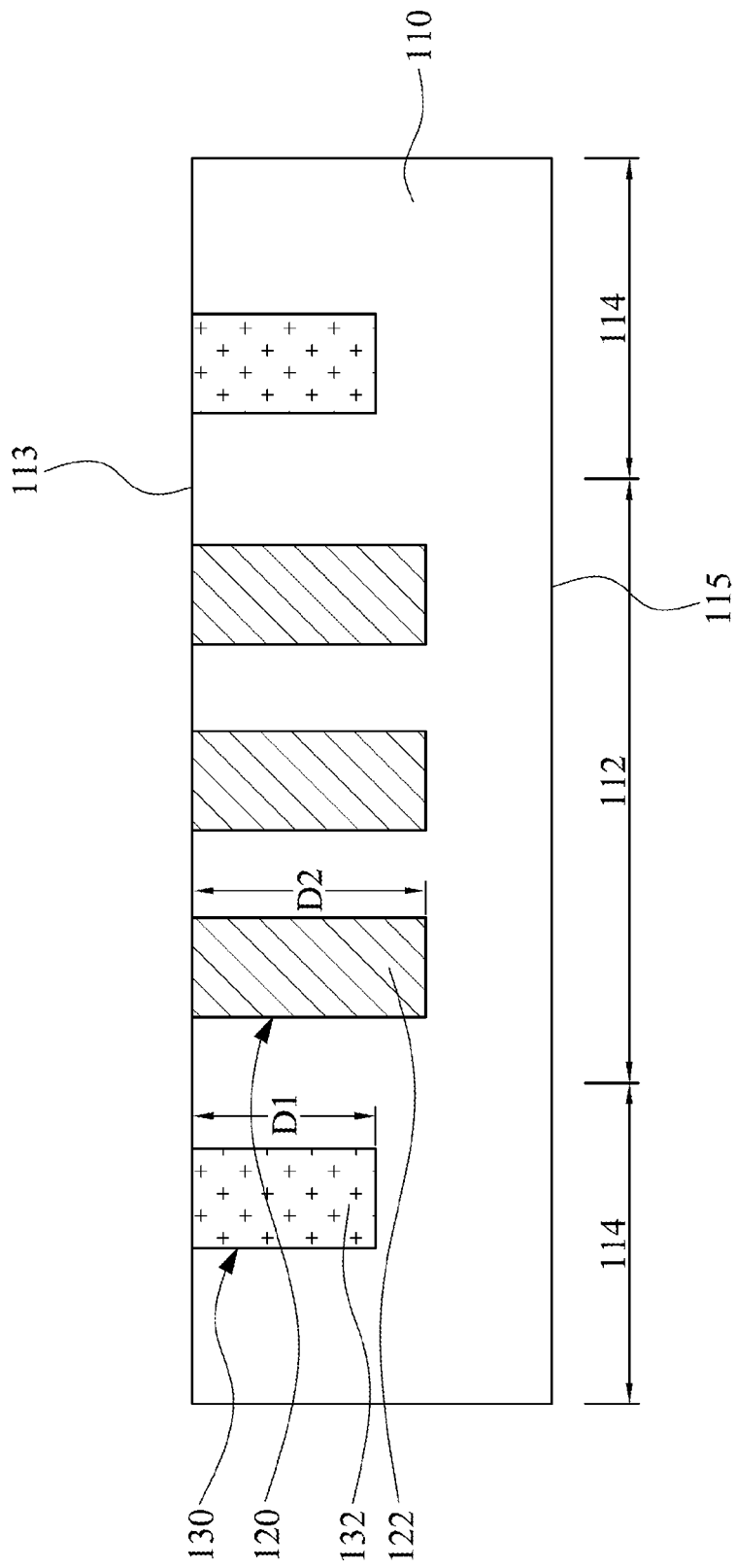
FIG. 2B is a cross-sectional view of the semiconductor structure in FIG. 1 along the line AA, according to various embodiments of the present disclosure.

Furthermore, the first through hole 120 and the second through hole 130 have the same depth D, since the first and second through hole 120, 130 are formed in the same process step, but not limited thereto. FIG. 2B is a cross-sectional view of the semiconductor structure in FIG. 1 along the line AA, according to various embodiments of the present disclosure. As illustrated in FIG. 2B, the first through hole 120 has a first depth D1, and the second through hole 130 has a second depth D2, which D1 is different from D2 since the first and second through hole 120, 130 are formed in the different process steps.

Continuing in FIG. 2A, the first through hole 120 is filled with conductive material 122, and the second through hole 130 is filled with isolation material 132. To be noticed, the substrate 110 is a semiconductor chip including a base substrate, a semiconductor device on the base substrate, a plurality of metal wires connected to the semiconductor device, and a inter-metal dielectric (IMD) layer covering the metal wires. In embodiments, the base substrate is formed of silicon, which the first through hole 120 is filled with conductive material 122 to form an active TSV (through silicon via) in the active region 112, and the second through hole 130 is filled with isolation material 132 to form a dummy TSV in the dummy region 114. Besides, the conductive material 122 in the first through hole 120 is in contact with the metal wires for transferring the signal from the semiconductor device to the external devices. In embodiments, the conductive material 122 includes copper, tungsten, polysilicon or combination thereof, but not limited thereto, other suitable conductive materials could be used to fill the first through hole 120.

However, the substrate 110 suffers a problem of warpage when filling the conductive material 122. The thermal expansion coefficients of the substrate 110 and the conductive material 122 are different, and thus induce unbalance stress warping the substrate 110 in the subsequence process. To solve the problem, the present disclosure uses the second through hole 130 to balance the stress induced from filling of the conductive material 122. As aforementioned, the second through hole 130 is filled with isolation material 132, and a Young's modulus E2 of the isolation material 132 is smaller than a Young's modulus E1 of the conductive material 122, to balance stress from the conductive material 122. The Young's modulus (modulus of elasticity) is calculated with dividing the tensile stress $\sigma$ by the extension strain $\in$. While applying the same tensile stress $\sigma$, the isolation material 132 with smaller Young's modulus will have larger extension strain $\in$, which means the isolation material 132 is soft and elastic to balance or offset the stress from the conductive material 122, and thus prevents the warpage of the substrate 110.

Because the Young's modulus E2 of the isolation material 132 is smaller than the Young's modulus E1 of the conductive material 122. Therefore, the Young's modulus E2 is small enough to satisfy excellent elasticity. In embodiments, the Young's modulus E1 of the conductive material 122 is over than 110 Gpa, and the Young's modulus E2 of the isolation material 132 is lower than 100 GPa. In embodiments, the Young's modulus E2 of the isolation material 132 is in a range from about 5 GPa to about 100 GPa. In various embodiments, the Young's modulus E2 of the isolation material 132 is in a range from about 5 GPa to about 50 GPa.

As aforementioned, the second through hole 130 is filled with isolation material 132 to form the dummy TSV, which is without connection to the internal device of the substrate 110. In embodiments, the isolation material 132 includes spin-on glass, spin-on dielectric, polyimide, silicon dioxide, or combination thereof. On the other hand, the second through hole 130 (dummy TSV) surrounds the first through hole 120 (active TSV) as illustrated in FIG. 1, but not limited thereto. In various embodiments, the second through hole 130 could be at any position in the dummy region 114, for example, at four corners of the substrate 110.

Figure 2C:
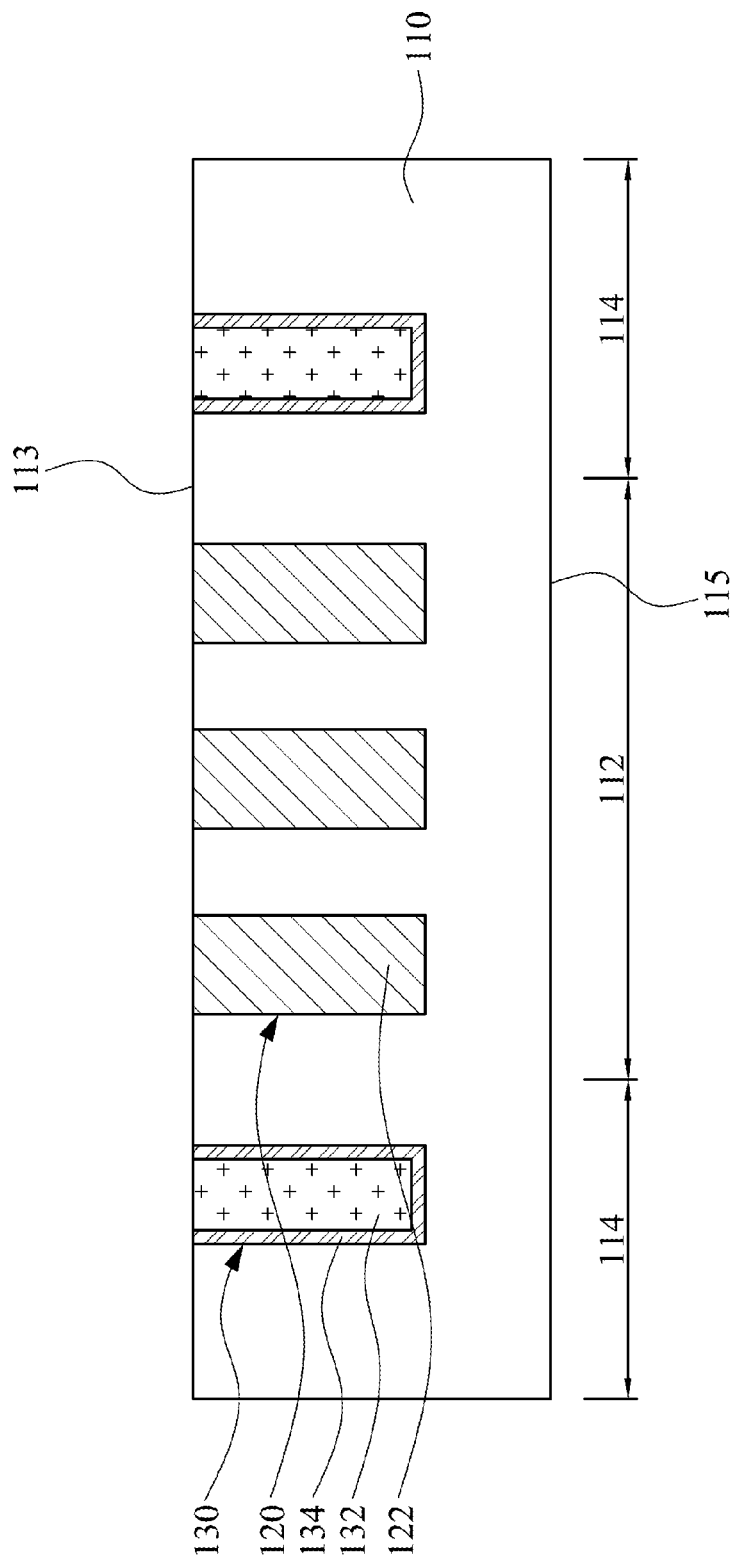
FIG. 2C is a cross-sectional view of the semiconductor structure in FIG. 1 along the line AA, according to various embodiments of the present disclosure.

Please refer to FIG. 2C, FIG. 2C is a cross-sectional view of the semiconductor structure in FIG. 1 along the line AA, according to various embodiments of the present disclosure. As illustrated in FIG. 2C, the first through hole 120 and the second through hole 130 extend from the first surface 113 to the second surface 115, and the first through hole 120 is filled with the conductive material 122 having the Young's modulus E1. The difference between FIG. 2A and FIG. 2C is that the second through hole 130 is filled with isolation materials having different Young's modulus to form a multi-layer structure in the second through hole 130. Referring to FIG. 2C, first isolation material 132 and second isolation material 134 are filled in the second through hole 130 to form a bi-layer structure therein, which the second isolation material 134 encompass the first isolation material 132, and a Young's modulus E2 of the first isolation material 132 and a Young's modulus E3 of the second isolation material 134 are smaller than the Young's modulus E1 of the conductive material 122. Therefore, the first isolation material 132 and the second isolation material 132 are soft and elastic to balance or offset the stress from the conductive material 122, and thus prevents the warpage of the substrate 110.

In embodiments, the Young's modulus E2 and the Young's modulus E3 are lower than 100 GPa. In some embodiments, the Young's modulus E2 and the Young's modulus E3 are in a range from about 5 GPa to about 100 GPa. In various embodiments, the Young's modulus E2 and the Young's modulus E3 are in a range from about 5 GPa to about 50 GPa.

Besides, the Young's modulus E2 is different from the Young's modulus E3. As shown in FIG. 2C, the second isolation material 134 encompassing the first isolation material 132 has larger Young's modulus. Accordingly, the second isolation material 134 acts as a buffer layer to reduce the risk of instantaneous deformation of the first isolation material 132, and thus further enhances the efficiency of the semiconductor structure 100. In various embodiments, the Young's modulus E2 is larger than the Young's modulus E3.

Please refer to FIGS. 3A to 3G to further clarify the process of manufacturing the semiconductor shown in FIG. 2A. FIGS. 3A to 3G are cross-sectional views of the semiconductor structure in FIG. 2A at an intermediate stage of fabrication, in accordance with various embodiments.

Figure 3A:
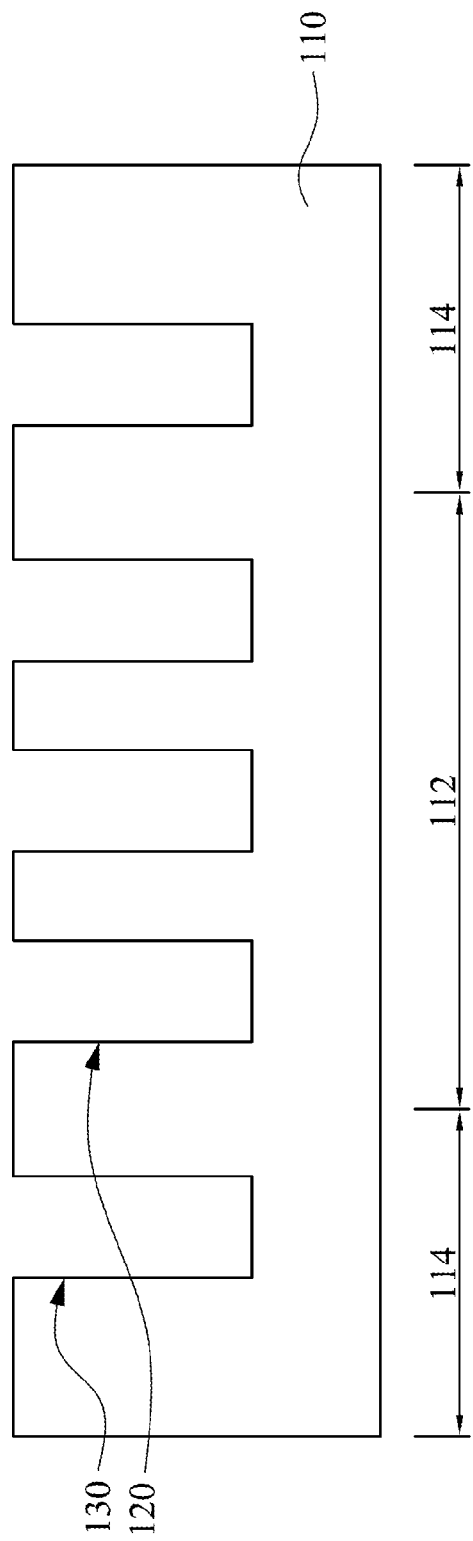
FIGS. 3A to 3G are cross-sectional views of the semiconductor structure in FIG. 2A at an intermediate stage of fabrication, in accordance with various embodiments.

As shown in FIG. 3A, a first through hole 120 and a second through hole 130 are formed in a substrate 110. The first through hole 120 and the second through hole 130 may be fabricated in the substrate 110 using suitable processes including photolithography and etching processes. The photolithography process may include forming a photoresist layer (not shown) overlying the substrate 110, exposing the photoresist layer to form a pattern, performing post-exposure bake processes, and developing the pattern to form a mask on the substrate 110. After that, the mask mentioned above is used to protect portions of the substrate 110, and the etching process removes the exposed portions of the substrate 110 to form the first through hole 120 and the second through hole 130. In embodiments, the first through hole 120 and the second through hole 130 are formed at the same time.

Figure 3B:
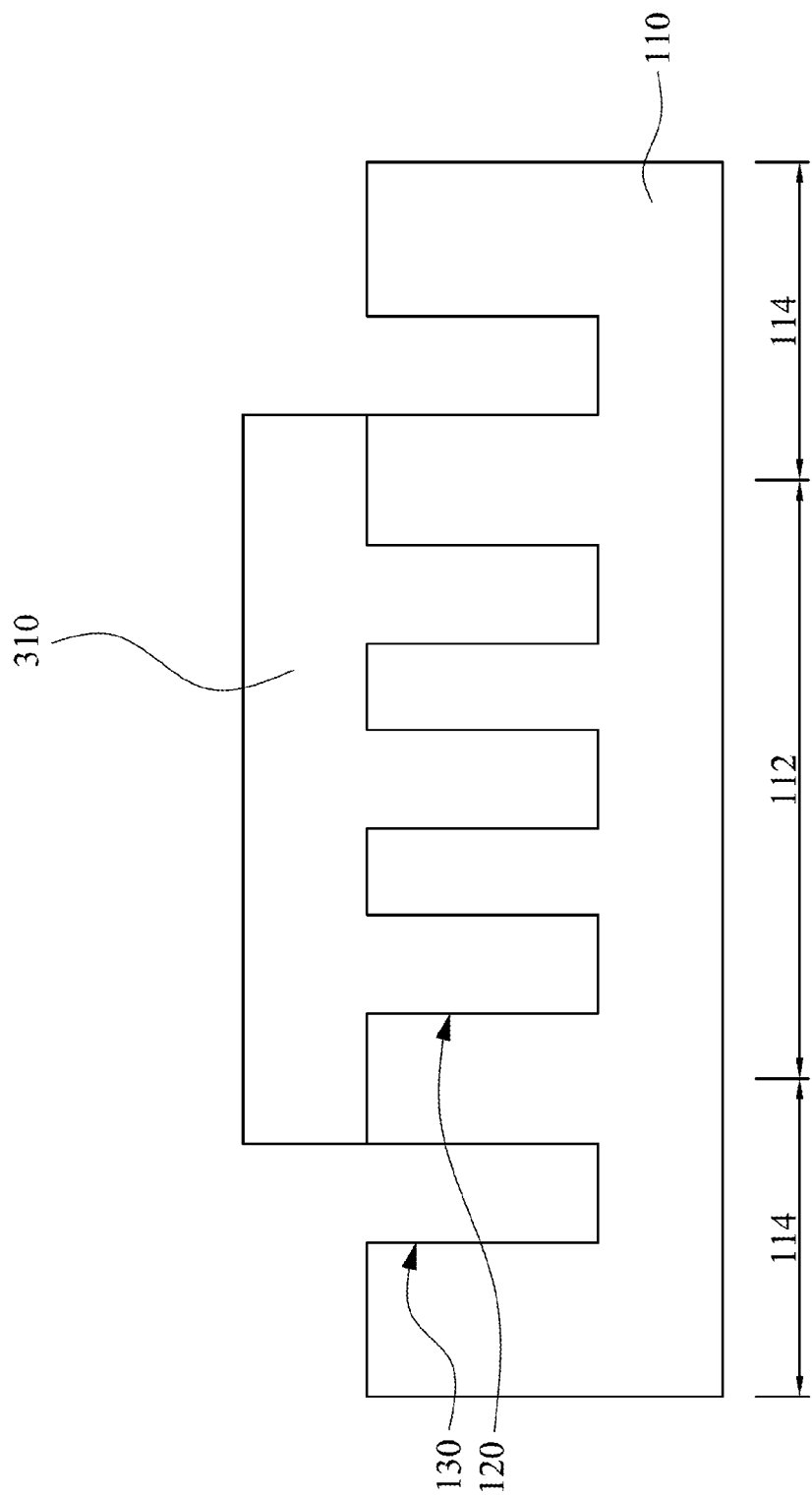

Continuing in FIG. 3B, a photoresist 310 is covered over the first through hole 120. The photoresist 310 is formed on the substrate 110 and filling the first through hole 120, which the second through hole 130 is exposed. In other words, the photoresist 310 protects the first through hole 120 in the active region 112.

Figure 3C:
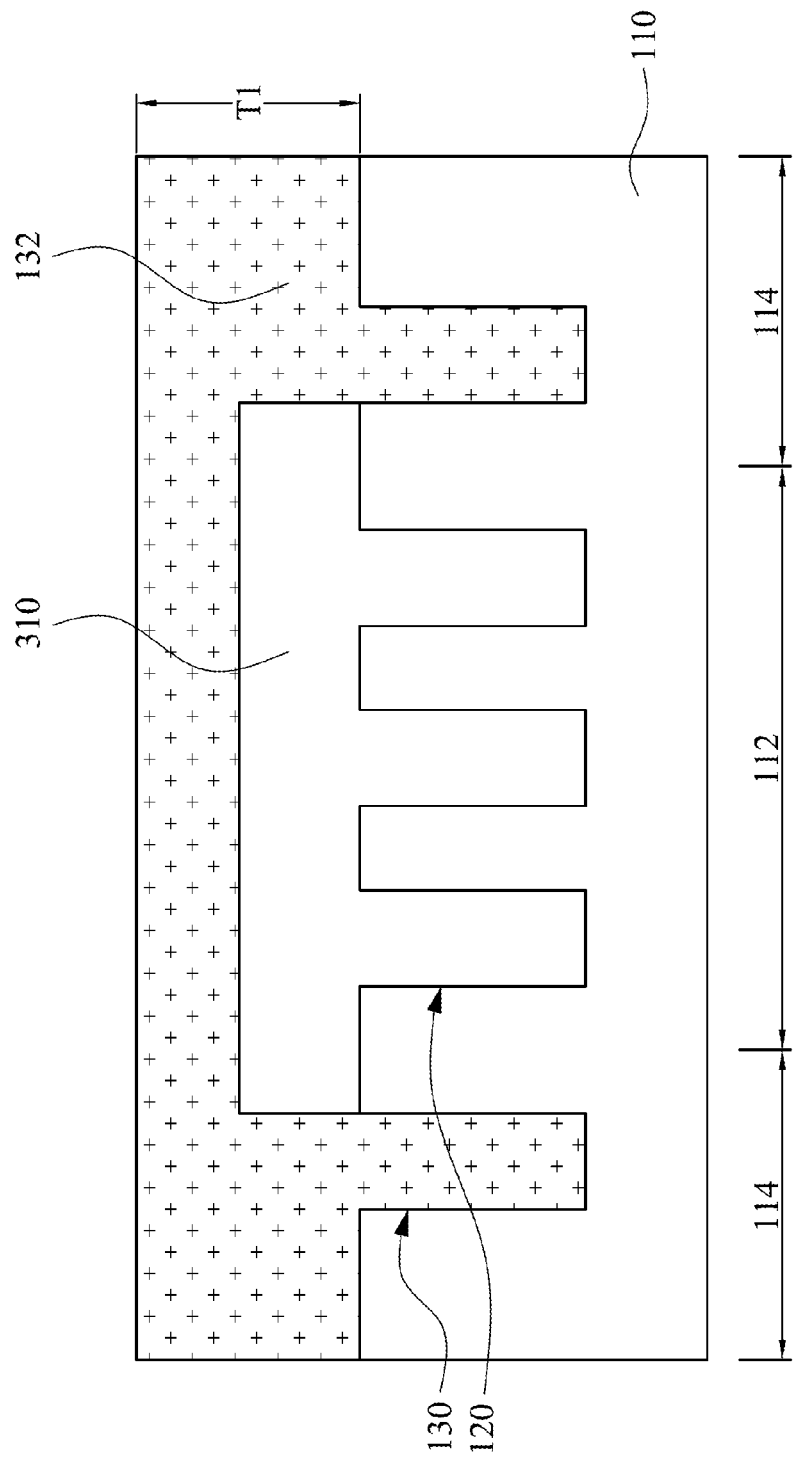

Continuing in FIG. 3C, isolation material 132 is filled in the second through hole 130. The isolation material 132 is formed over the substrate 110, portion of the isolation material 132 is on the substrate 110 and the photoresist 310, and portion of the isolation material 132 is in the second through hole 130 to fully fill the second through hole 130. Besides, the photoresist 310 and the isolation material 132 form a thickness T1 above the substrate 110. In embodiments, the isolation material 132 is formed using CVD, PVD, coating process, but not limited thereto.

Figure 3D:
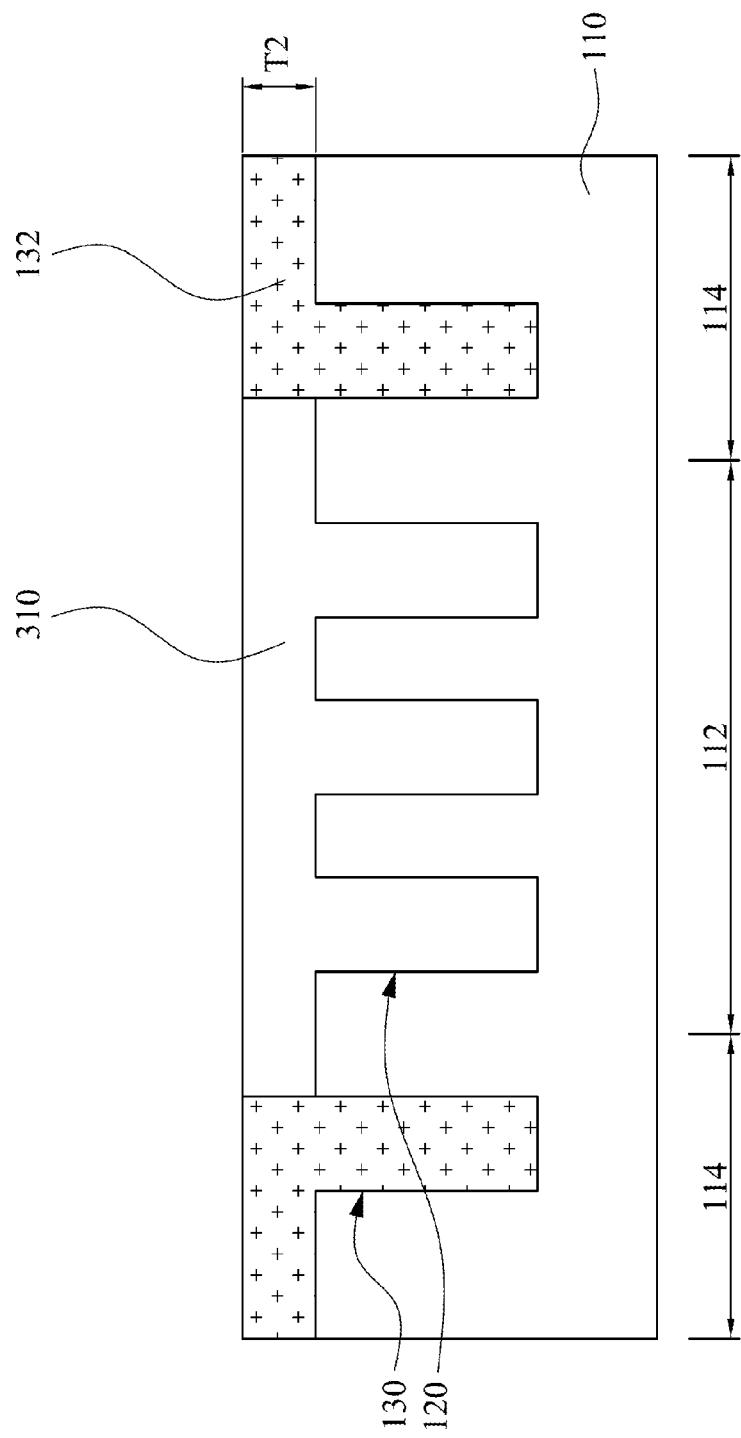
Figure 3E:
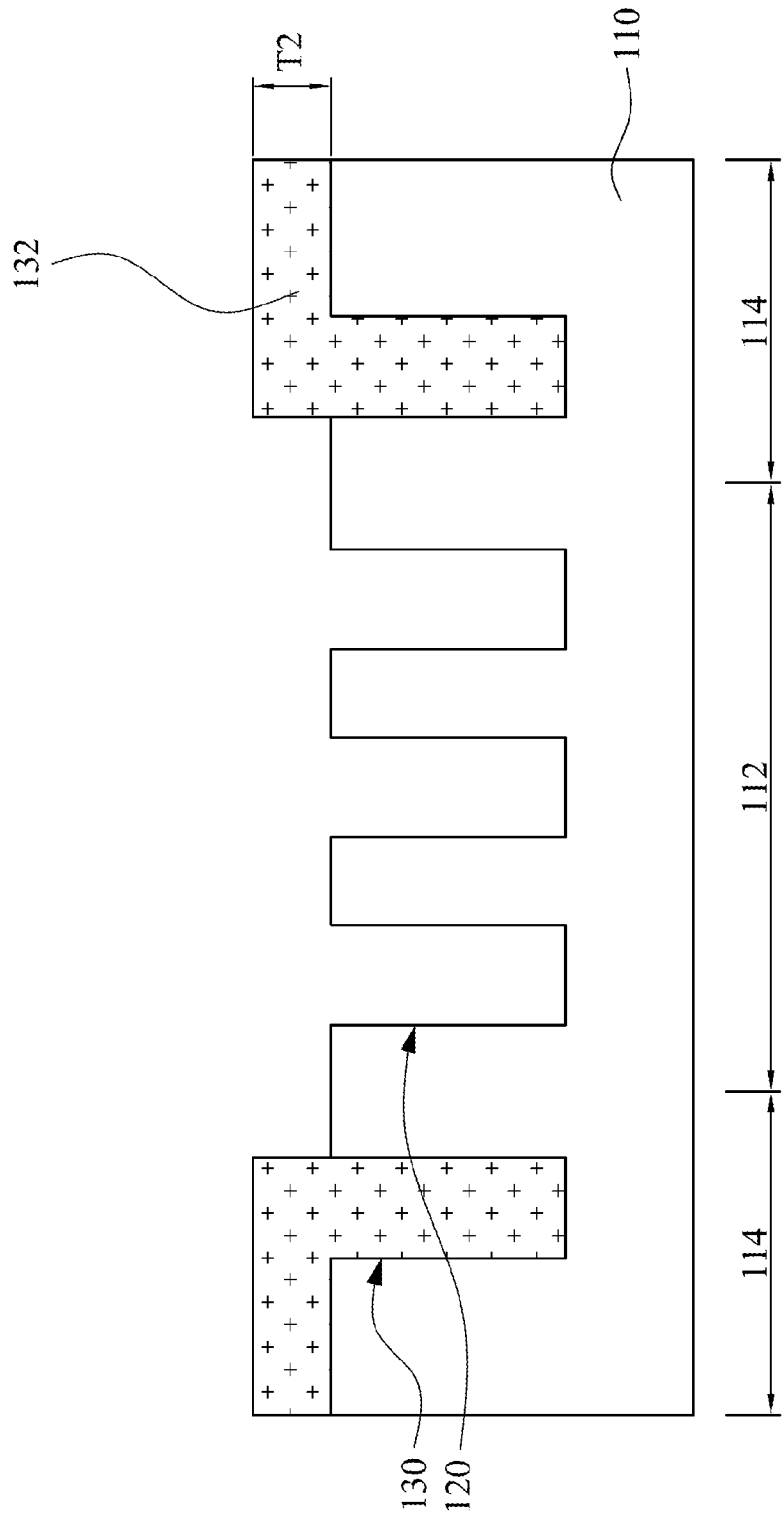

Continuing in FIG. 3D, the thickness of the photoresist 310 and the isolation material 132 above the substrate 110 is reduced. A CMP process or an etching process is applied to remove the photoresist 310 and the isolation material 132, and thus the thickness above the substrate 110 is reduced from T1 to T2. Furthermore, the isolation material 132 on the photoresist 310 is also removed to expose the photoresist 310. In embodiments, the CMP process or the etching process completely removes the photoresist 310 and the isolation material 132 above the substrate 110 to reduce the thickness from T1 to 0. After that, the photoresist 310 is removed to formed the structure shown in FIG. 3E. In FIG. 3E, the first through hole 120 is exposed after removing the photoresist 310.

Figure 3F:
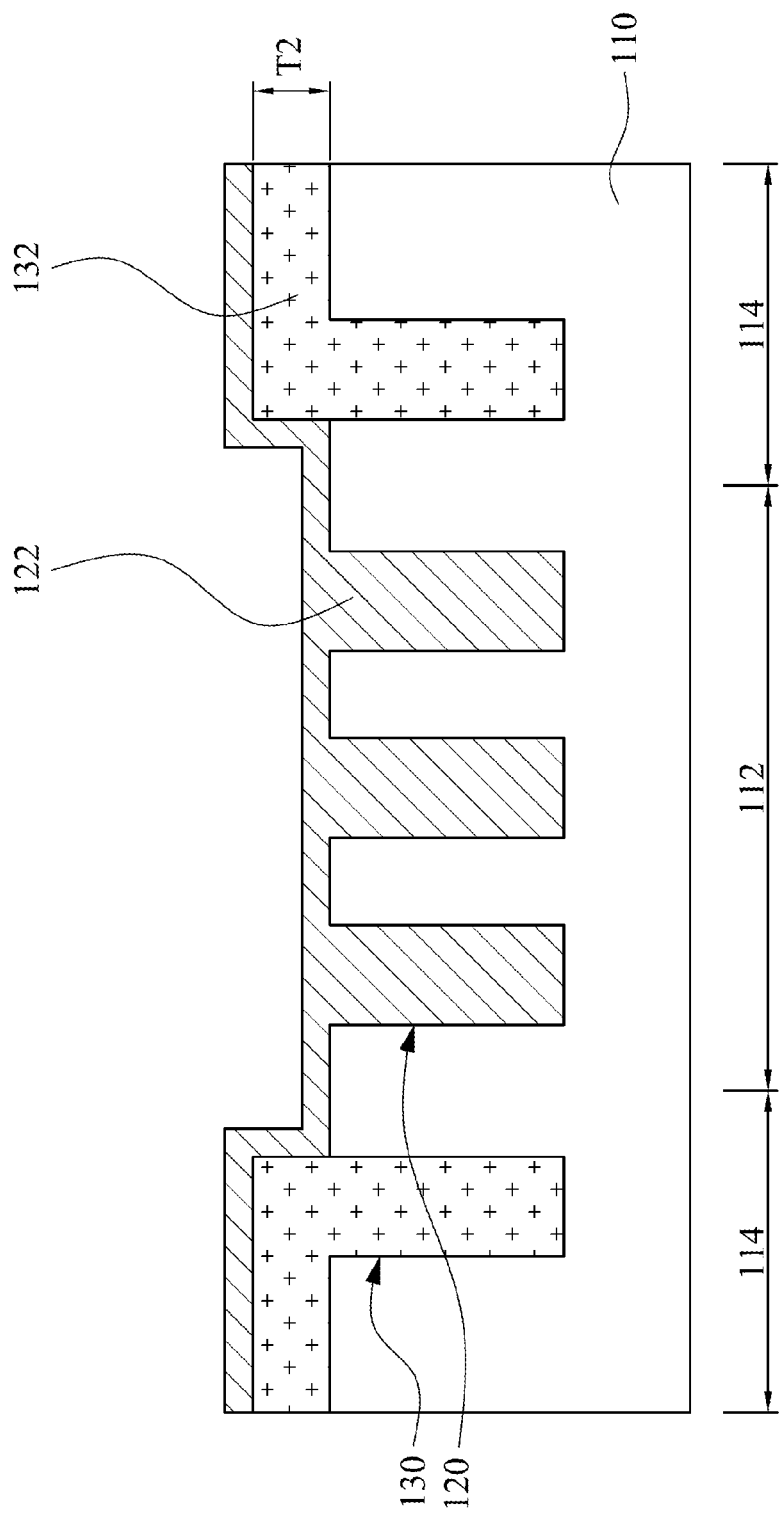

Continuing in FIG. 3F, conductive material 122 is filled in the first through hole 120. The conductive material 122 is formed over the substrate 110, portion of the conductive material 122 is on the substrate 110 and the isolation material 132, and portion of the conductive material 122 is in the first through hole 120 to fully fill the first through hole 120. In embodiments, the conductive material 122 is formed using electroplating, sputtering, depositing process, but not limited thereto.

Figure 3G:
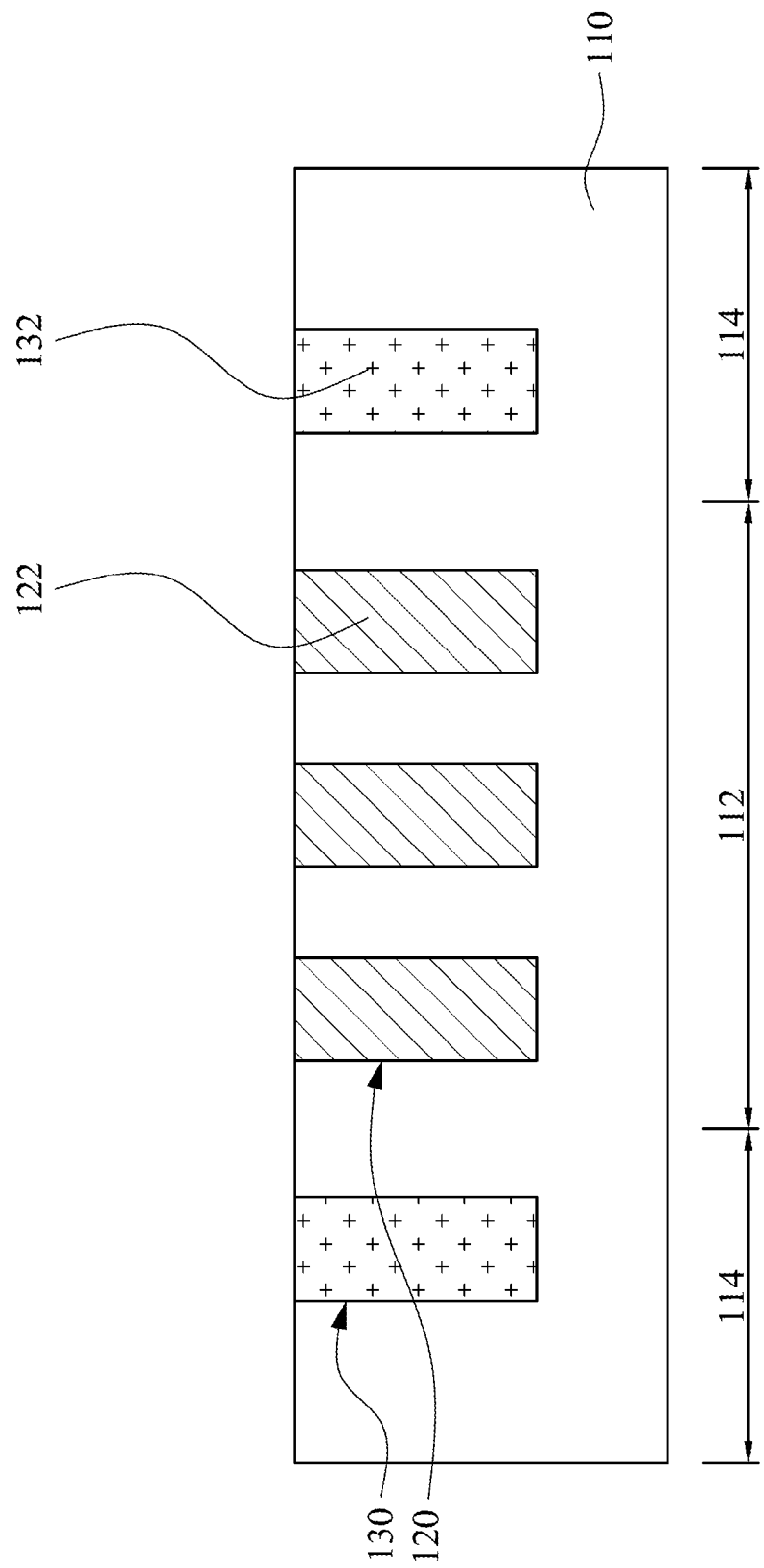

Continuing in FIG. 3G, the conductive material 122 and the isolation material 132 above the substrate 110 is removed. A CMP process is applied to completely remove the conductive material 122 and the isolation material 132 above the substrate 110, and the semiconductor structure shown in FIG. 2A is formed.

Please refer to FIGS. 4A to 4G to further clarify the process of manufacturing the semiconductor shown in FIG. 2A. FIGS. 4A to 4G are cross-sectional views of the semiconductor structure in FIG. 2A at an intermediate stage of fabrication, in accordance with various embodiments.

Figure 4A:
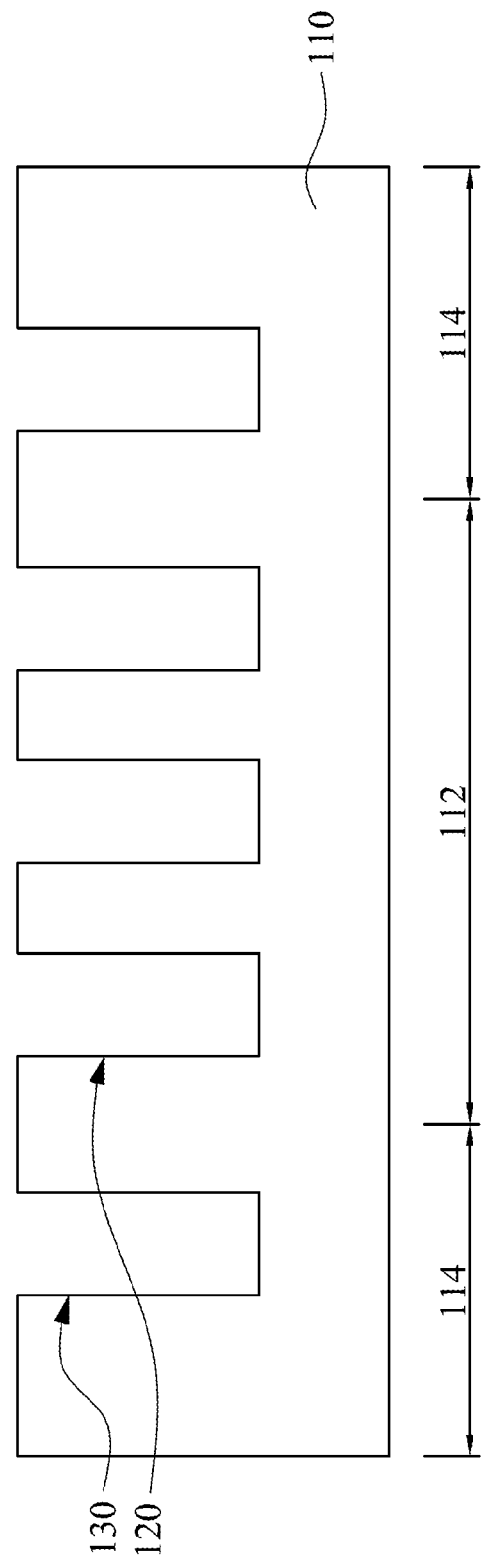
FIGS. 4A to 4G are cross-sectional views of the semiconductor structure in FIG. 2A at an intermediate stage of fabrication, in accordance with various embodiments.

As shown in FIG. 4A, a first through hole 120 and a second through hole 130 are formed in a substrate 110. The first through hole 120 and the second through hole 130 may be fabricated in the substrate 110 using suitable processes including photolithography and etching processes as described in FIG. 3A, and the details are not described herein. In embodiments, the first through hole 120 and the second through hole 130 are formed at the same time.

Figure 4B:
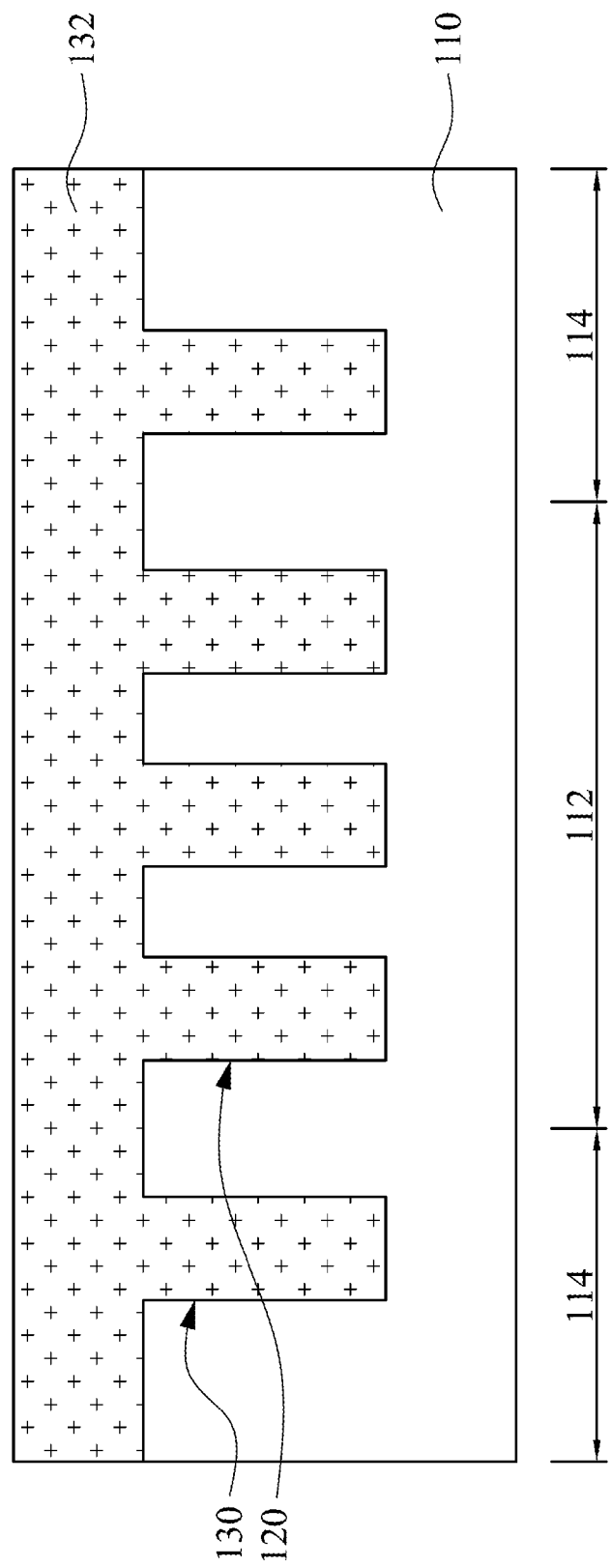

Continuing in FIG. 4B, isolation material 132 is filled in the first through hoe 120 and the second through hole 130. The isolation material 132 is formed over the substrate 110, and portion of the isolation material 132 is in the first through hole 120 and the second through hole 130 to fully fill the first through hole 120 and the second through hole 130. In embodiments, the isolation material 132 is formed using CVD, PVD, coating process, but not limited thereto.

Figure 4C:
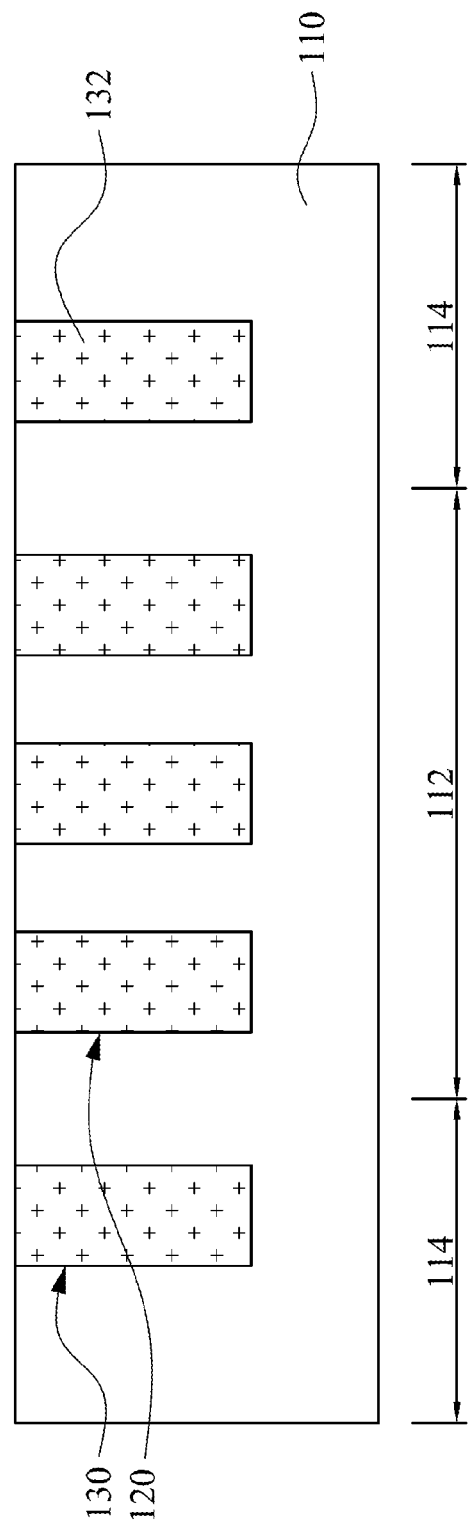

Continuing in FIG. 4C, the isolation material 132 above the substrate 110 is removed. A CMP process or an etching process is applied to completely remove the isolation material 132 above the substrate 110.

Figure 4D:
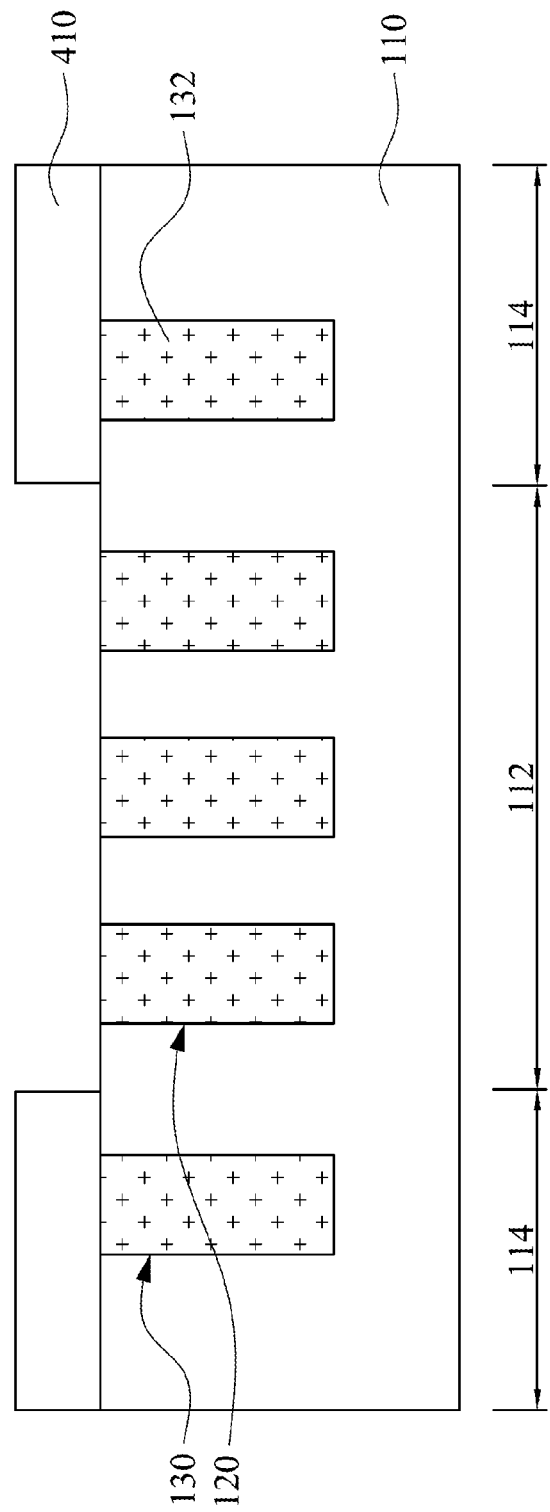

Continuing in FIG. 4D, a photoresist 410 is covered over the second through hole 130. The photoresist 410 is formed on the substrate 110 to protect the isolation material 132 in the second through hole 130. In other words, the isolation material 132 in the first through hole 120 is exposed.

Figure 4E:
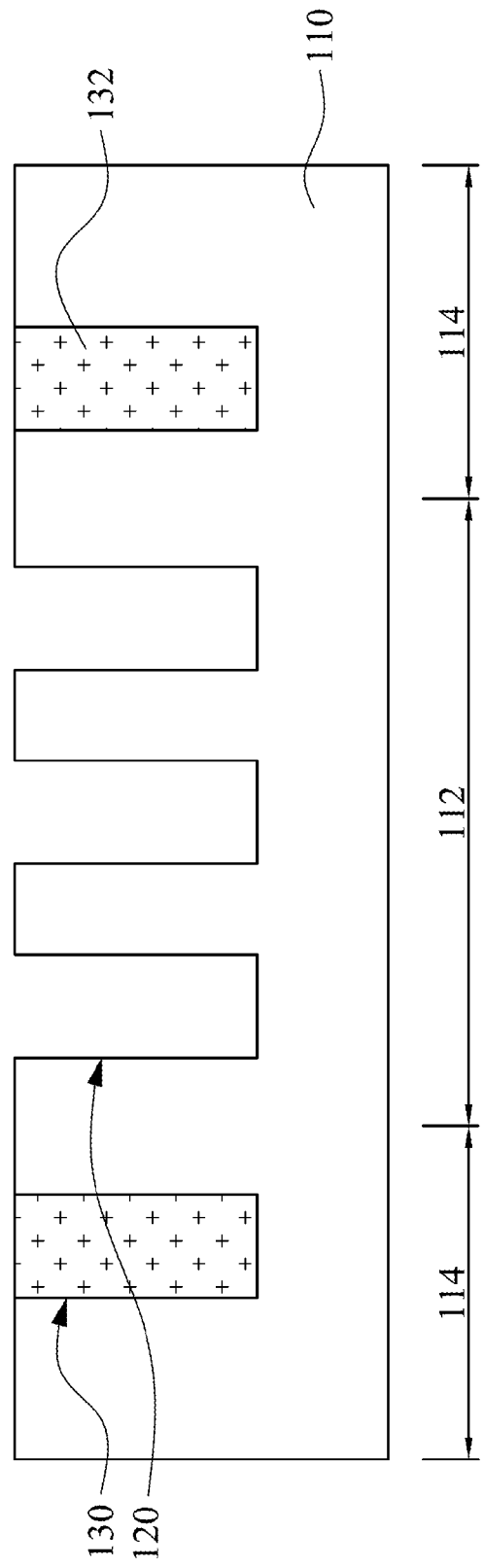

Continuing in FIG. 4E, the isolation material 132 in the first through hole 120 is removed to form an empty first through hole 120. Since the isolation material 132 in the first through hole 120 is exposed, a wet etching process is applied to totally remove the isolation material 132 in the first through hole 120, but the photoresist 410 protects the second through hole 130 to remain the isolation material 132 in the second through hole 130. After that, the photoresist 410 is removed.

Figure 4F:
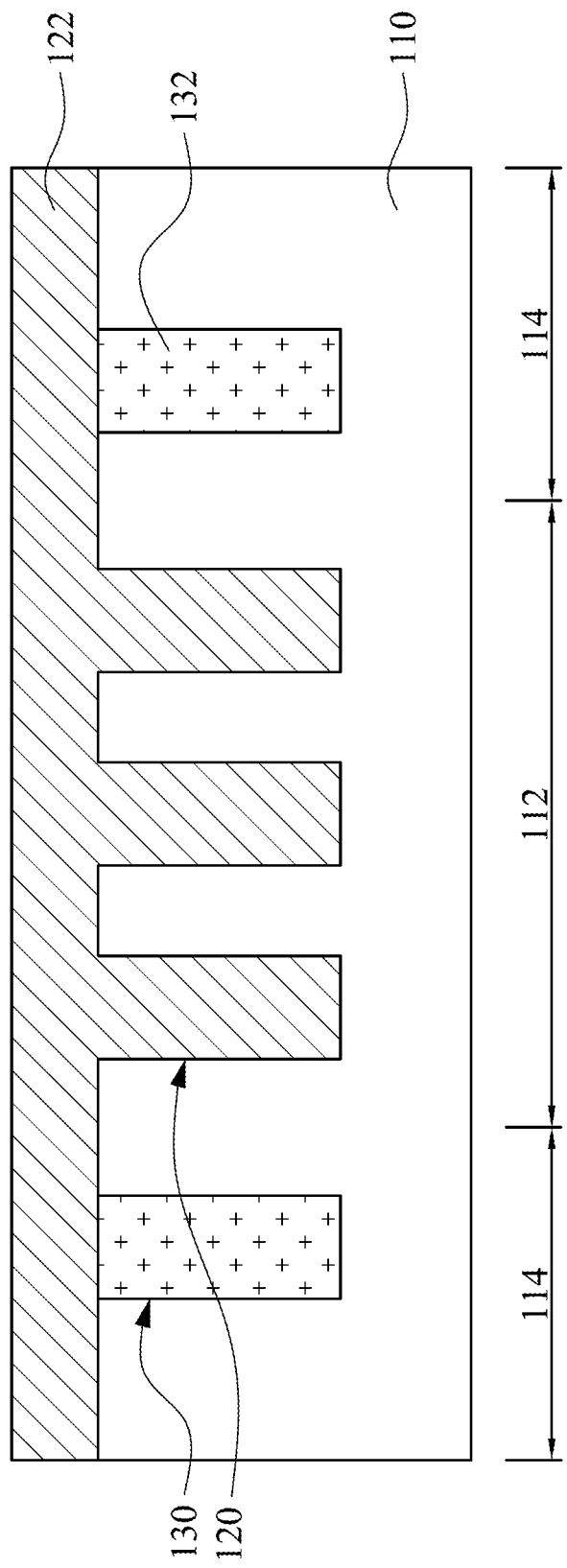

Continuing in FIG. 4F, conductive material 122 is filled in the first through hole 120. The conductive material 122 is formed over the substrate 110, portion of the conductive material 122 is on the substrate 110 and the isolation material 132, and portion of the conductive material 122 is in the first through hole 120 to fully fill the first through hole 120. In embodiments, the conductive material 122 is formed using electroplating, sputtering, depositing process, but not limited thereto.

Figure 4G:
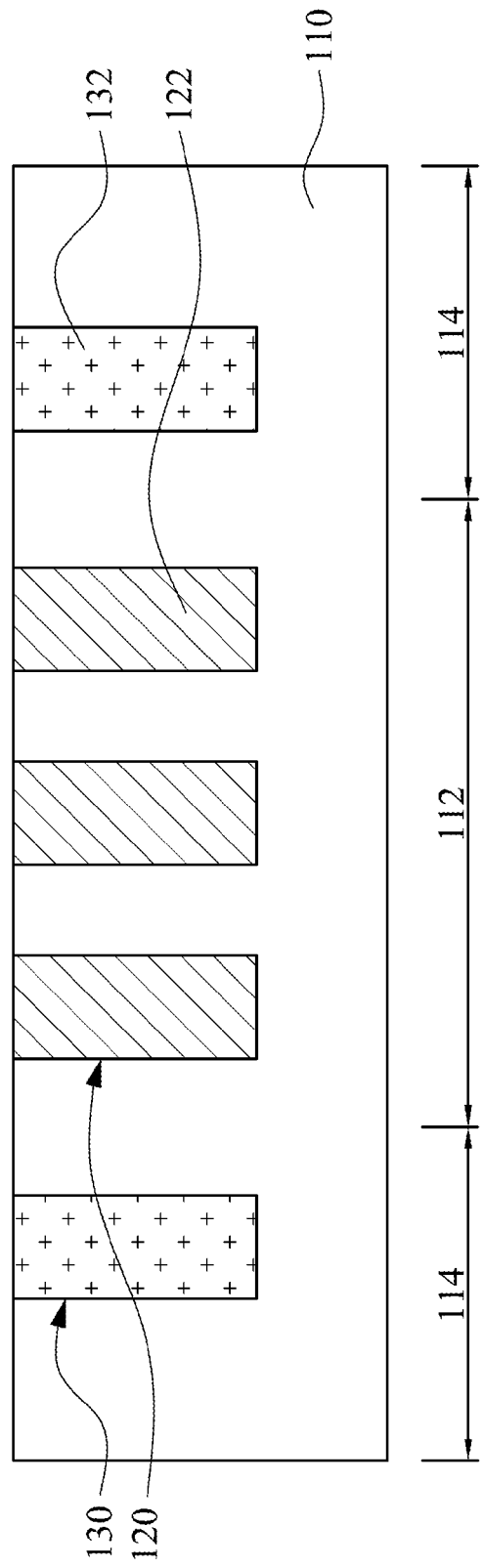

Continuing in FIG. 4G, the conductive material 122 above the substrate 110 is removed. A CMP process is applied to completely remove the conductive material 122 above the substrate 110, and the semiconductor structure shown in FIG. 2A is formed.

As aforementioned, the first through hole 120 and the second though hole 130 could extend from the second surface 115 to the first surface 113. More specifically, the first through hole 120 and the second though hole 130 are fabricated at backside of the substrate. Please refer to FIGS. 5A to 5E to further clarify the present disclosure. FIGS. 5A to 5E are cross-sectional views of the semiconductor structure at an intermediate stage of fabrication, in accordance with various embodiments.

Figure 5A:
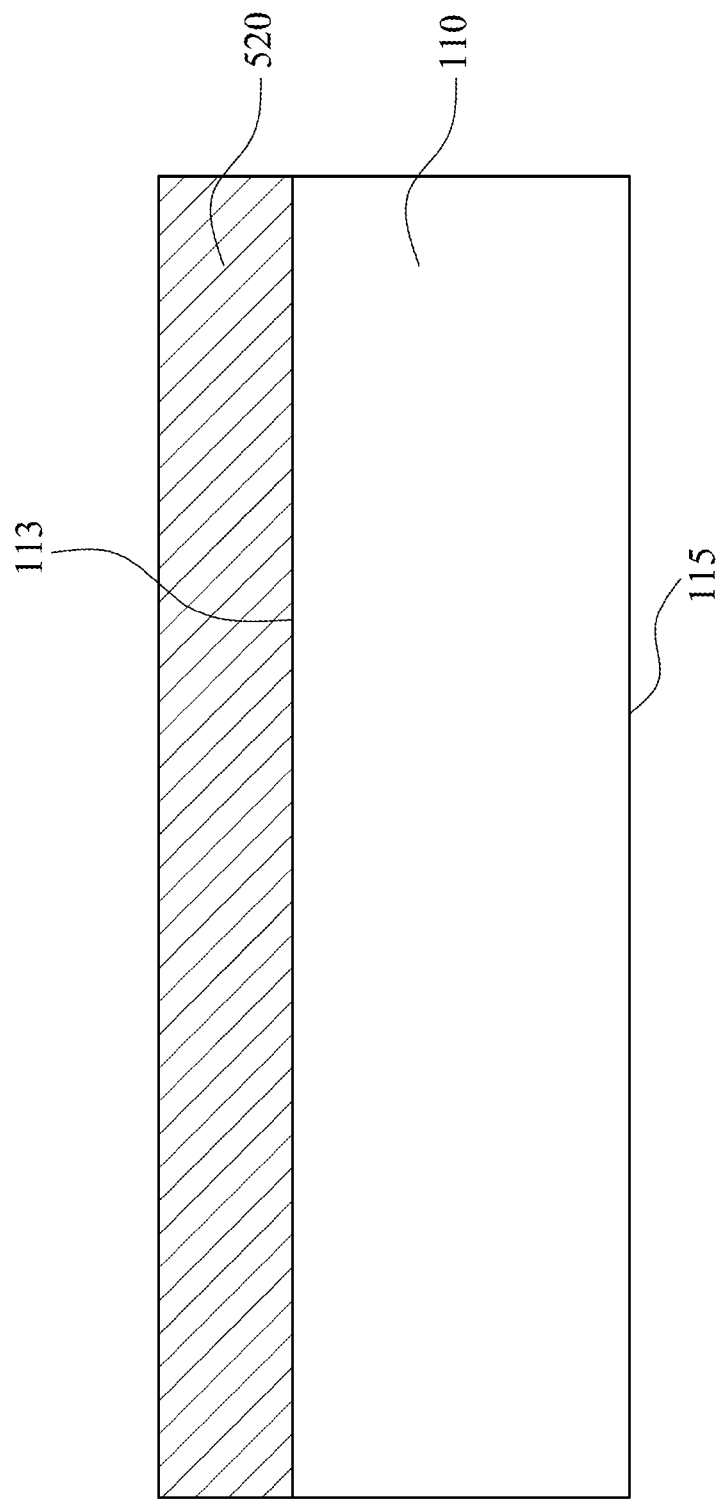
FIGS. 5A to 5D are cross-sectional views of the semiconductor structure at an intermediate stage of fabrication, in accordance with various embodiments.
Figure 5B:
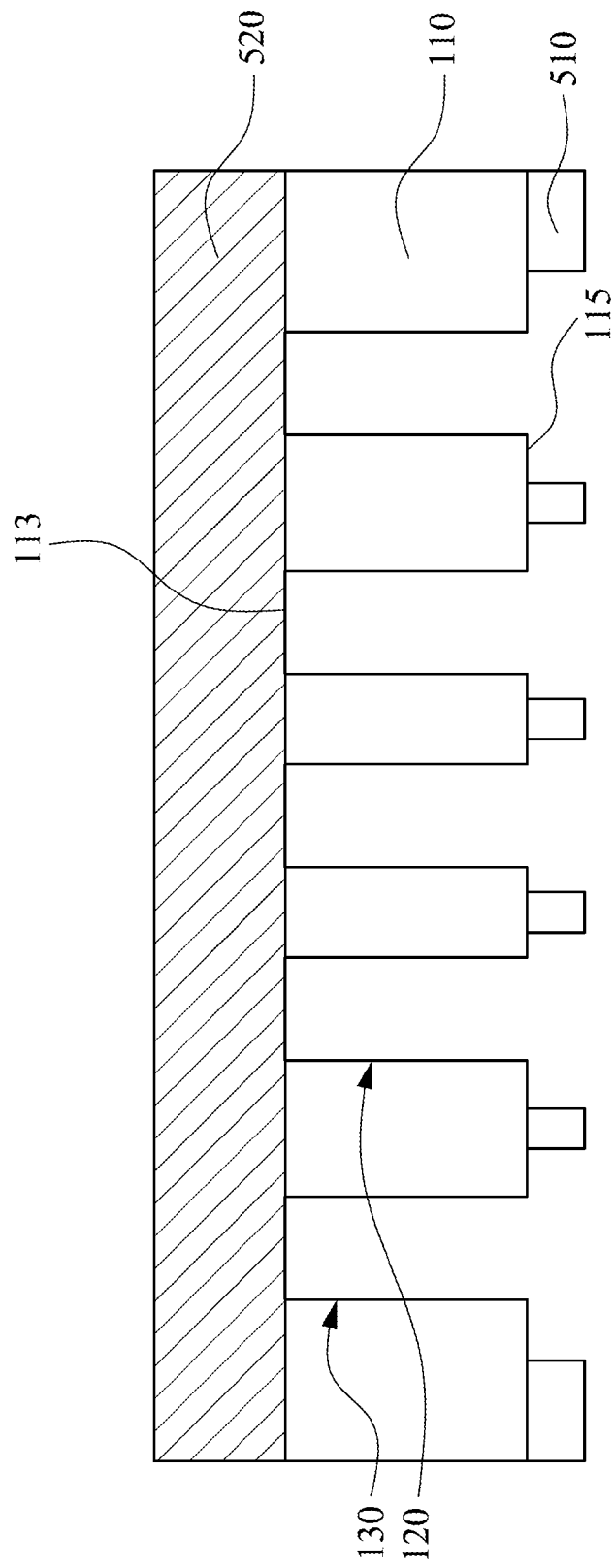

As shown in FIG. 5A, a substrate 110 is provided. The substrate 110 includes a first surface 113 and a second surface 115 opposite to the first surface 113. To be noticed, FIGS. 5A to 5E illustrate a via last process, an interconnect 520 is already fabricated on the first surface 113 of the substrate 110, and the first through hole 120 and the second through hole 130 are fabricated at the backside of the substrate 110 in the subsequent process. The process begins with grinding the second surface 115 to reduce the thickness of the substrate 110, and an oxide layer 510 is formed below the second surface 115. After that, a dual damascene etching process is performed to remove portion of the oxide layer 510 and portion of the substrate 110, and the first through hole 120 and the second through hole 130 shown in FIG. 5B are formed to expose the interconnect 520.

Figure 5C:
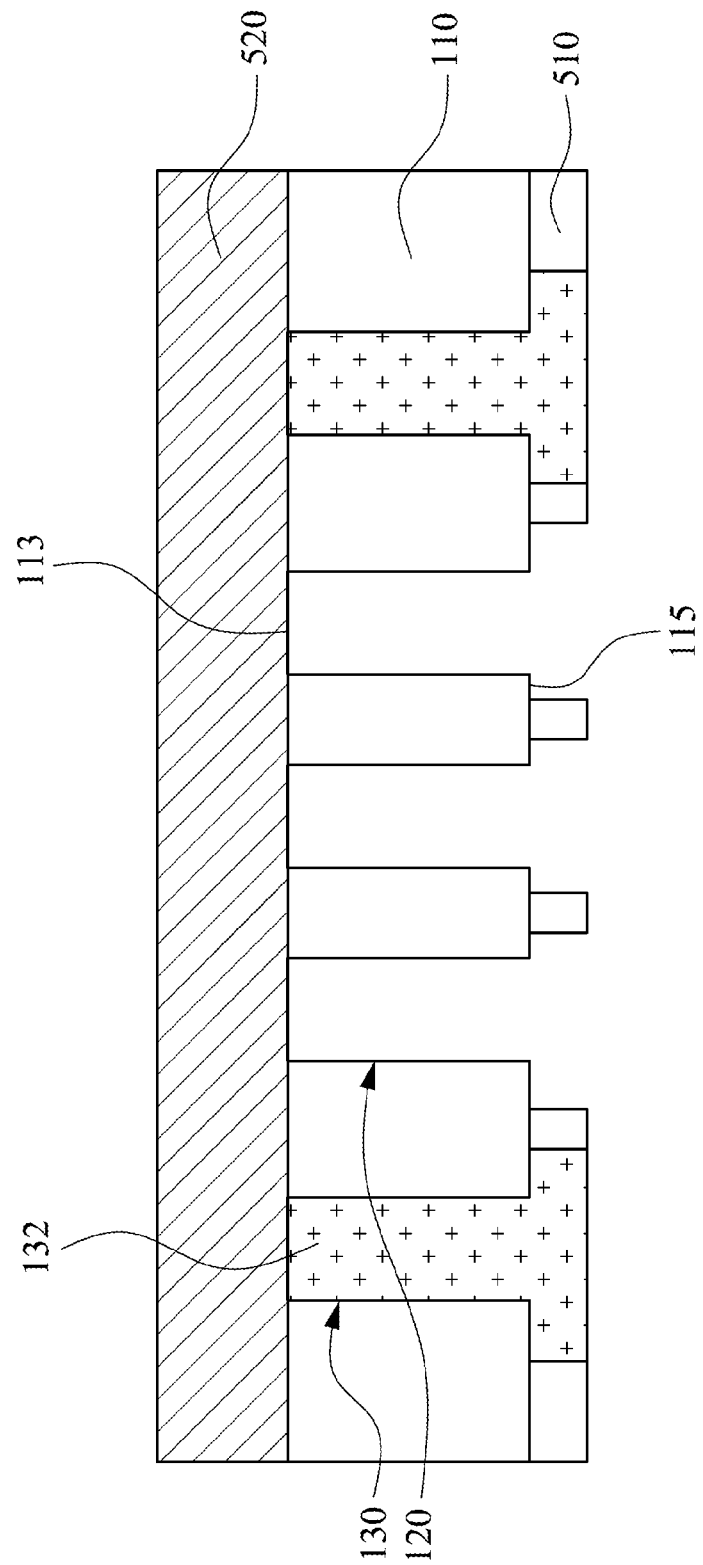

Continuing in FIG. 5C, isolation material 132 is filled in the second through hole 130. For example, a photoresist (not shown) is applied to protect the first through hole 120, and the isolation material 132 is formed over the second surface 115 to fully fill the second through hole 130. Besides, a CMP process is performed to remove excess isolation material 132 on the second surface 115, and the photoresist in the first through hole 120 is also removed.

Figure 5D:
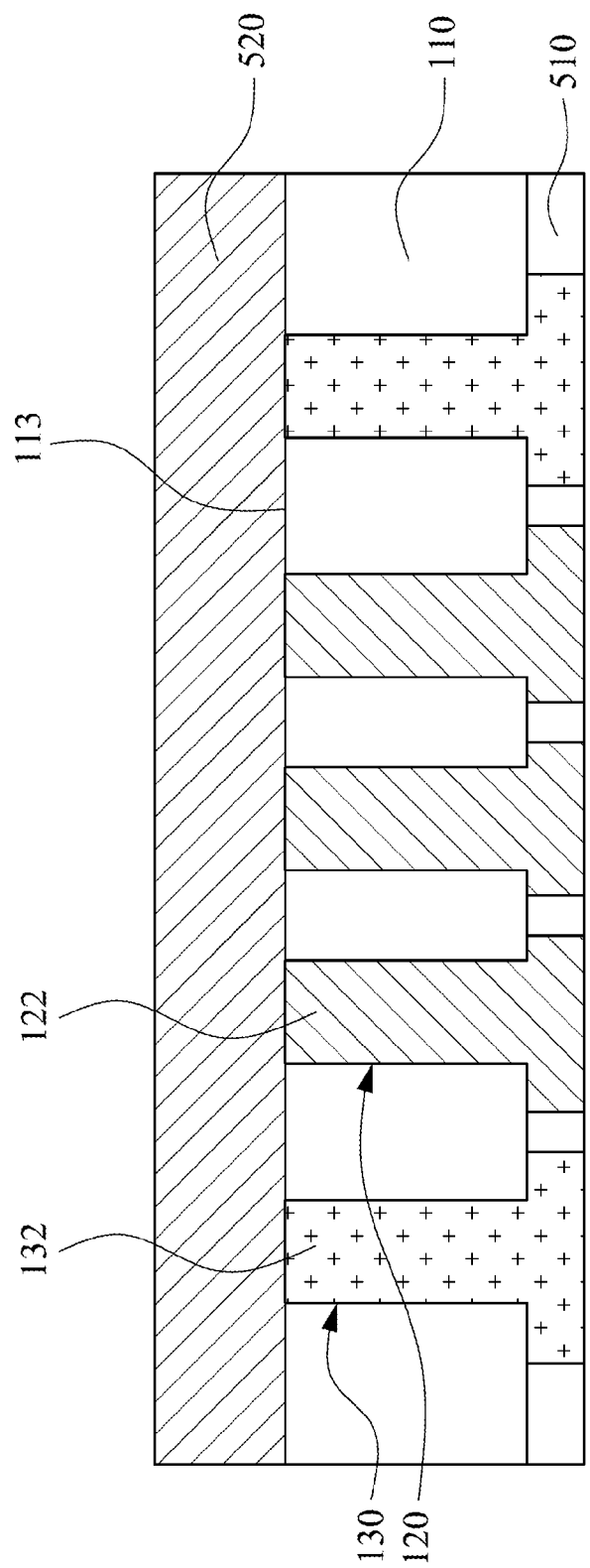

Continuing in FIG. 5D, conductive material 122 is filled in the first through hole 120. After removing the photoresist, the conductive material 122 is formed over the second surface 115 to fully fill the first through hole 120. Therefore, the conductive material 122 contacts the interconnect 520 exposed in the first through hole 120 to provide electrical connection. Also, a CMP process is performed to remove excess conductive material 122 on the second surface 115, and the semiconductor structure having the active TSV and dummy TSV on the backside is formed.

The embodiments of the present disclosure discussed above have advantages over existing semiconductor structures and processes, and the advantages are summarized below. The present disclosure uses the second through hole to balance the stress induced from filling of the conductive material, which the second through hole is filled the isolation material having the Young's modulus lower than 100 GPa. Therefore, the isolation material includes excellent elasticity to balance or offset the stress from the conductive material, and thus prevents the warpage of the substrate.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor structure, comprising:
   a substrate;
   a first through hole disposed in the substrate and filled with conductive material; and
   a second through hole disposed in the substrate and filled with isolation material, and a Young's modulus of the isolation material being smaller than a Young's modulus of the conductive material to balance stress from the conductive material.

2. The semiconductor structure of claim 1, wherein the conductive material comprises copper, tungsten, polysilicon, or combination thereof.

3. The semiconductor structure of claim 1, wherein the Young's modulus of the conductive material is over than 110 GPa.

4. The semiconductor structure of claim 1, wherein the Young's modulus of the isolation material is smaller than 100 GPa.

5. The semiconductor structure of claim 4, wherein the Young's modulus of the isolation material is in a range from about 5 GPa to about 100 GPa.

6. The semiconductor structure of claim 5, wherein the Young's modulus of the isolation material is in a range from about 5 GPa to about 50 GPa.

7. The semiconductor structure of claim 1, wherein the isolation material comprises spin-on glass, spin-on dielectric, polyimide, silicon dioxide, or combination thereof.

8. The semiconductor structure of claim 1, wherein the second through hole is filled with isolation materials having different Young's modulus to form a multi-layer structure in the second through hole.

9. The semiconductor structure of claim 1, wherein the first through hole and the second through comprise the same depth.

10. The semiconductor structure of claim 1, wherein the first through hole and the second through comprise different depths.

11. The semiconductor structure of claim 1, wherein the substrate comprises a first surface and a second surface opposite to the first surface.

12. The semiconductor structure of claim 11, wherein the first through hole and the second through hole extend from the first surface to the second surface.

13. The semiconductor structure of claim 11, wherein the first through hole and the second through hole extend from the second surface to the first surface.

14. The semiconductor structure of claim 1, wherein the second through hole surrounds the first through hole.

* * * * *